(12) United States Patent
Mikalauskas

(10) Patent No.: US 6,980,063 B2
(45) Date of Patent: *Dec. 27, 2005

(54) TRANSMISSION LINE PARASITIC ELEMENT DISCONTINUITY CANCELLATION

(75) Inventor: Frank G. Mikalauskas, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 37 days.

This patent is subject to a terminal disclaimer.

(21) Appl. No.: 10/910,028

(22) Filed: Aug. 3, 2004

(65) Prior Publication Data

US 2005/0001692 A1 Jan. 6, 2005

Related U.S. Application Data

(63) Continuation of application No. 10/697,130, filed on Oct. 30, 2003, now Pat. No. 6,791,429, which is a continuation of application No. 09/970,550, filed on Oct. 3, 2001, now Pat. No. 6,710,675.

(60) Provisional application No. 60/239,020, filed on Oct. 4, 2000.

(51) Int. Cl.$^7$ ............................................... H01P 3/08
(52) U.S. Cl. ............................. 333/1; 333/34; 333/238
(58) Field of Search ................................. 333/1, 33, 34, 333/238

(56) References Cited

U.S. PATENT DOCUMENTS

| 5,432,484 A | * | 7/1995 | Klas et al. ...................... 333/1 |
| 6,359,536 B1 | * | 3/2002 | Sakamoto et al. ........... 333/246 |
| 6,365,961 B1 | * | 4/2002 | Tomie .......................... 257/664 |
| 6,710,675 B2 | * | 3/2004 | Mikalauskas ................. 333/34 |
| 6,791,429 B2 | * | 9/2004 | Mikalauskas ................... 333/1 |

* cited by examiner

Primary Examiner—Stephen E. Jones

(57) ABSTRACT

A discontinuity, such as a via, in a signal transmission line can introduce a parasitic element that affects the signal transmission. The method in accordance with embodiments of the present invention are directed to counteracting the transmission line parasitic element discontinuity. The method includes determining the amount of parasitic capacitance or inductance that is introduced at a portion of the transmission line, such as by the via. A suitable amount of delay is introduced to the transmission line by way of correction impedance in order to counteract the affects of the parasitic element. The delay is calculated taking into account at least in part the correction impedance and the parasitic element effect. The correction impedance is suitably added to a portion of the transmission line at which the parasitic element is present.

21 Claims, 5 Drawing Sheets

TRANSMISSION LINE PARASITIC ELEMENT DISCONTINUITY CANCELLATION

CLAIM OF PRIORITY

The present application claims the benefit of and incorporates by reference U.S. Provisional Application Ser. No. 60/239,020, filed 4 Oct. 2000. The present application further claims the benefit of and incorporates by reference U.S. Utility Application Ser. No. 09/970,550 filed on 3 Oct. 2001. This is a continuation of application Ser. No. 10/697,130 filed on 30 Oct. 2003 U.S. Pat. No. 6,791,429 which is a continuation of Ser. No. 09/970,550 filed Oct. 3, 2001, now U.S. Pat. No. 6,710,675, which is hereby incorporated by reference.

BACKGROUND

Buses are commonly used in computers and other electronic devices to send signals containing data from a driving (or generation) point to any number of receiving points. These busses can be created in printed circuit technology or from cables attached from one point to a second point. Backplane buses use circuit cards that plug in at regular intervals and represent loads along the bus. Cable busses employ cables with uniform electrical parameters that are connected at load devices in, for example, a daisy-chain fashion. Such a connection is used, for example, in Small Computers Systems Interface (SCSI) implementations.

The SCSI type of bus is also adaptable for use within backplane architectures. In systems of this type, the cable bus is replaced with a printed circuit board backplane. Intelligent peripheral devices, in the form of daughter boards, are then connected to the backplane connectors. The backplane architecture provides a compact and efficient method for connecting a series of intelligent peripheral devices to a computer system.

To work properly, a bus must maintain certain electrical characteristics. One of these characteristics is a controlled impedance. For an unloaded bus (i.e., a bus with no attached intelligent peripheral devices), the intrinsic impedance ($Z_0$) can be calculated using the intrinsic impedance per unit length ($L_0$) and the intrinsic capacitance per unit length ($C_0$) in the following equation:

$$Z_0 = (L_0/C_0)^{1/2}$$

For a loaded bus, the preceding equation must be modified to reflect the effect of the attached load devices. This is most always in the form of added capacitance attributable to the attached load devices. Specifically, for a loaded bus the impedance ($Z'$) can be calculated by modifying the preceding equation to include the load capacitance per unit length ($C_d$) resulting in the following equation:

$$Z' = (L_0/(C_0 + C_d))^{1/2}$$

Based on this equation, it may be appreciated that increasing the load capacitance per unit length ($C_d$) will result in decreasing values for the loaded impedance ($Z'$). Unfortunately, in backplane architectures, the buses are relatively short with each load device being separated by a relatively short distance. Since each load device adds capacitance to the bus, there is a tendency for backplane architectures to have relatively high values for load capacitance per unit length ($C_d$). The result is that these architectures may be characterized by low intrinsic low values for impedance ($Z'$). Low values for impedance ($Z'$) results in a slow propagation speed for signals within the bus. This degrades the performance of the bus, making it more prone to operational errors and electrical noise.

To overcome the degrading effects of decreasing impedance, designers have been faced with a difficult compromise. One possible solution is to increase the length of the bus included in backplane architectures. Typically this is achieved by increasing the effective distance that each signal must travel between adjacent intelligent peripheral devices. Unfortunately, this requires that the size of the backplane be increased or that each signal path be routed in a tortuous pattern between adjacent load devices. The use of a tortuous pattern increases the difficulty of routing the signal paths within the backplane and may require that additional signals layers be added to the backplane. In either case, the cost of the backplane can be increased significantly. Another possible solution is to decrease the clock speed of the bus. Of course, this negatively impacts the performance of the bus, thereby making this solution generally unacceptable.

In addition to the problems discussed above, using RAMBUS technology, current computer data speeds may operate at 800 mega-transfers per second. As a result, the edge rates of the data pulses are on the order of 200 picoseconds or 0.2 nanoseconds. For high speed data ASIC comparisons distortions may occur due to reflections of the data signal from the terminating end of the data signal path. This path may include the path through the silicon itself. Further the silicon path also has parasitic load that must be dealt with.

At these very high speeds (edge rates) the effect of otherwise small reactive components attached to electrical interconnects can have a very detrimental effect. The high speed edge rates of the Rambus-generated signals (e.g., in the Alpha EV7 that uses Rambus signals extensively) would cause significant signal reflections off of parasitic load points such as PWB routing vias or connector pins. Also, the transmission line electrical discontinuities caused by these physical discontinuities (like vias and connector pin metallization) would cause a noise margin reduction of these signals and possible logical failures.

Therefore there is now a need for a high speed bus or signal transmission line that has acceptable electrical signal impedance characteristics and operates at acceptable clock speeds.

SUMMARY

The embodiments of the present invention address the aforementioned and related problems that are associated with a parasitic element. Since a discontinuity, such as a via, in a signal transmission line can introduce the parasitic element which affects the signal transmission, embodiments of the present invention provides a method and system directed to counteracting that transmission line parasitic element discontinuity.

More specifically, as embodied and broadly described herein, the system includes signal transmission line and a correction transmission line. The correction transmission line includes, based on the characteristics of the parasitic element, an inductance or a capacitance. The correction transmission line is positioned in the signal transmission line before or after the parasitic element.

In further accordance, as embodied and broadly described herein, one technique includes determining a value of a parasitic element, be it a capacitive or an inductive parasitic element, that exists at a portion of a signal transmission line which has an impedance. This technique also includes calculating a delay associated with a correction impedance of a correction transmission line that, based at least in part on the parasitic element value and the correction impedance of the correction transmission line, is operative to increase the signal transmission line impedance if the parasitic element is capacitive and to decrease the signal transmission line impedance if the parasitic element is inductive. This technique further includes adding the correction transmission line to the portion of the signal transmission line at which the parasitic element exists.

In accordance with this technique, the correction transmission line is divided equally and each half-part thereof is applied to the signal transmission line. Moreover, the half-parts of the correction transmission line are added one before and one after the parasitic element.

In another embodiment, a technique enhances signal transmission characteristics of a signal transmission line. This technique includes determining an intrinsic capacitance (or inductance) of a parasitic element that exists at a discontinuity portion of a signal transmission line which has an impedance. This technique further includes calculating a delay associated with a correction impedance that, based at least in part on the intrinsic capacitance (or inductance) and the correction impedance, is operative to increase the signal transmission line impedance (or decrease the signal transmission line impedance if it is an intrinsic inductance of the parasitic element). Furthermore, this technique includes adding the correction impedance to the signal transmission line so that one half of the calculated delay is added before and the other half of the calculated delay is added after the portion of the signal transmission line at which the parasitic element exists.

An advantage of a representative embodiment of the present invention is that it can eliminate the negative affects of parasitic element discontinuity within an electrical system.

Another advantage of a representative embodiment of the present invention is that it provides for the precise calculation of operating characteristics that are affected by capacitance cancellation.

Yet another advantage of a representative embodiment of the present invention is that it controls the impedance and cross talk levels in the ASCI design and incorporates features that cancel out the negative effects of the input capacitance of the silicon die.

Other advantages a representative embodiment of the present invention are that it enhances the manufacturing of electrical systems, is cost efficient, and is easy to implement.

Further advantages of embodiments of the present invention will be understood by those skilled in the art from the description herein. The advantages the embodiments of the invention will also be realized and attained from practice of the invention disclosed herein.

BRIEF DESCRIPTION OF THE DRAWINGS

The aforementioned and related advantages and features of the present invention will become apparent upon reviewing the following detailed description of embodiments of the invention, taken in conjunction with the following drawings, where like numerals represent like elements, in which.

DETAILED DESCRIPTION

Figure 1:
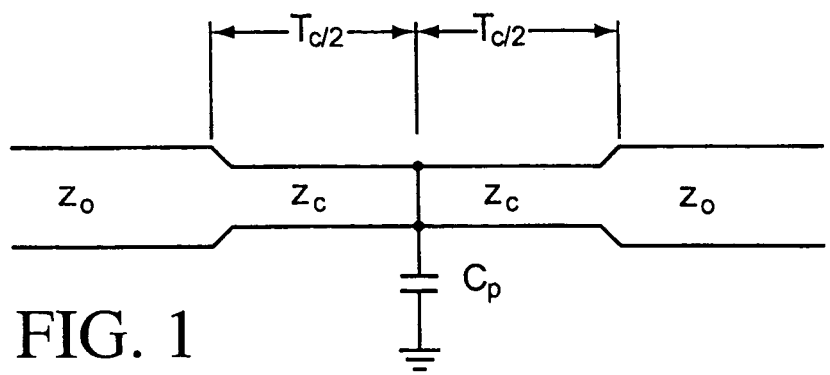
FIG. 1 illustrates correcting the transmission line in order to compensate for parasitic capacitance.

Embodiments of the present invention will now be described with reference to FIGS. 1–7. This detailed description is provided for the purposed of illustration and description. Although the present invention is described with respect to a specific embodiment, various changes and modifications may be suggested to persons of ordinary skill in the art, and it is intended that the present invention encompass such changes and modifications as they fall within the scope of the claims appended hereto.

Embodiments of the present invention allow for a cancellation (correction) of parasitic elements on a signal transmission line, be they capacitive or inductive, by the use of a length of "correcting" transmission line with a propagation time Tc. The correcting transmission line will have a characteristic impedance, for example Zc, and an intrinsic propagation delay per unit length of Dc (i.e., picoseconds per inch). The parasitic element to be cancelled out or counteracted could be a parallel connected capacitance Cp (such as a stub connected PWB via) or a series connected inductance Ls (such as a series connected PWB via connector pin). The nominal impedance of the signal transmission line is Zo with a nominal delay of Do. Embodiments of the invention allow for a general mathematical solution to calculate the exact amount of transmission line propagation delay of a correcting transmission line to cancel out the impedance discontinuity caused by the reactive parasitic element.

For the correction of a parallel connected parasitic capacitive load the correcting transmission line impedance (Zc) will need to be higher than the normal impedance in the circuit (Zo) and of a delay Tc=(Zc*Cp)/((Zc/Zo)^2−1). For the correction of a parasitic series inductance, the correcting impedance Zc will need to be lower than the normal impedance in the circuit and of a delay Tc=(Ls/Zc)/((Zo/Zc)^2−1). When applied properly, the impedance Zc is "loaded down" to Zo by a parasitic capacitance Cp, or Zc is "raised up" to Zo by the parasitic inductance Ls. The control of the impedance mismatch comes at a price. There is a known time delay introduced by the correcting transmission line. This will be the value of Tc (the intrinsic unloaded delay of the Zc transmission media) times the ratio of Zc/Zo for capacitive parasitic cancellation or Tc times the ratio of Zo/Zc for inductive parasitic cancellation. This non-intrinsic delay penalty shall be called Tc'. For high frequency applications (fast edge rates) the value of Zc should not be close to Zo to minimize the value of Tc' which should not exceed one-half the edge rate of the signal involved if parasitic cancellation is to be effective.

The correcting transmission line of impedance Zc and delay Dc could be any conveniently allowed transmission line impedance, speed, and form factor (coaxial, twisted, etc.). The general application can be created on a printed wiring board by etching the correcting transmission line at the same time that the normal signal impedance Zo is being etched. This will result in both transmission lines having the same propagation velocity (or unit delay Do), and there will be no additional time or cost involved. Higher impedances for Zc for capacitive parasitic cancellation can be traces etched narrower than the nominal impedance Zo and lower impedances for Zc can be etched wider than the nominal traces. The preferred implementation divides the calculated time of Tc, for the chosen impedance Zc, into two halves. Each half of Tc is placed on either side of the parallel capacitance of the series inductance.

With respect to FIG. 1, it can be seen that the signal path is narrower before and after the parasitic capacitance Cp. The length of each narrow region is Tc/2. Each of the narrow regions has a chosen impedance Zc, while the thick regions of signal path have impedance Zo. Using the formulas as discussed above, the dimensions of the signal transmission path can therefore be customized to eliminate unwanted capacitance. Using conventional integrated circuit package signal transmission path designs, embodiments of the present invention are able to compensate or eliminate up to 2.5 pF of capacitance for a signal with a rise time of 200 picoseconds.

Figure 2:
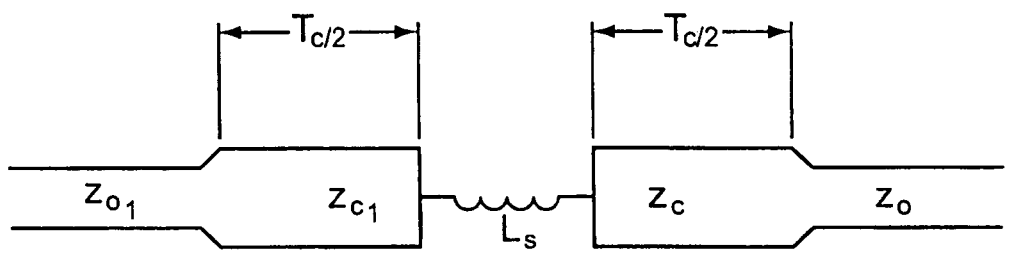
FIG. 2 illustrates correcting the transmission line in order to compensate for parasitic inductance.

FIG. 2 shows a signal transmission path that has been designed to eliminate a series inductance Ls. In this example, the necessary chosen impedance Zc is less than Zo so the signal path is made wider in the region adjacent both sides of the inductor Ls. Each side of the wide region of signal path is again Tc/2.

Figure 3:
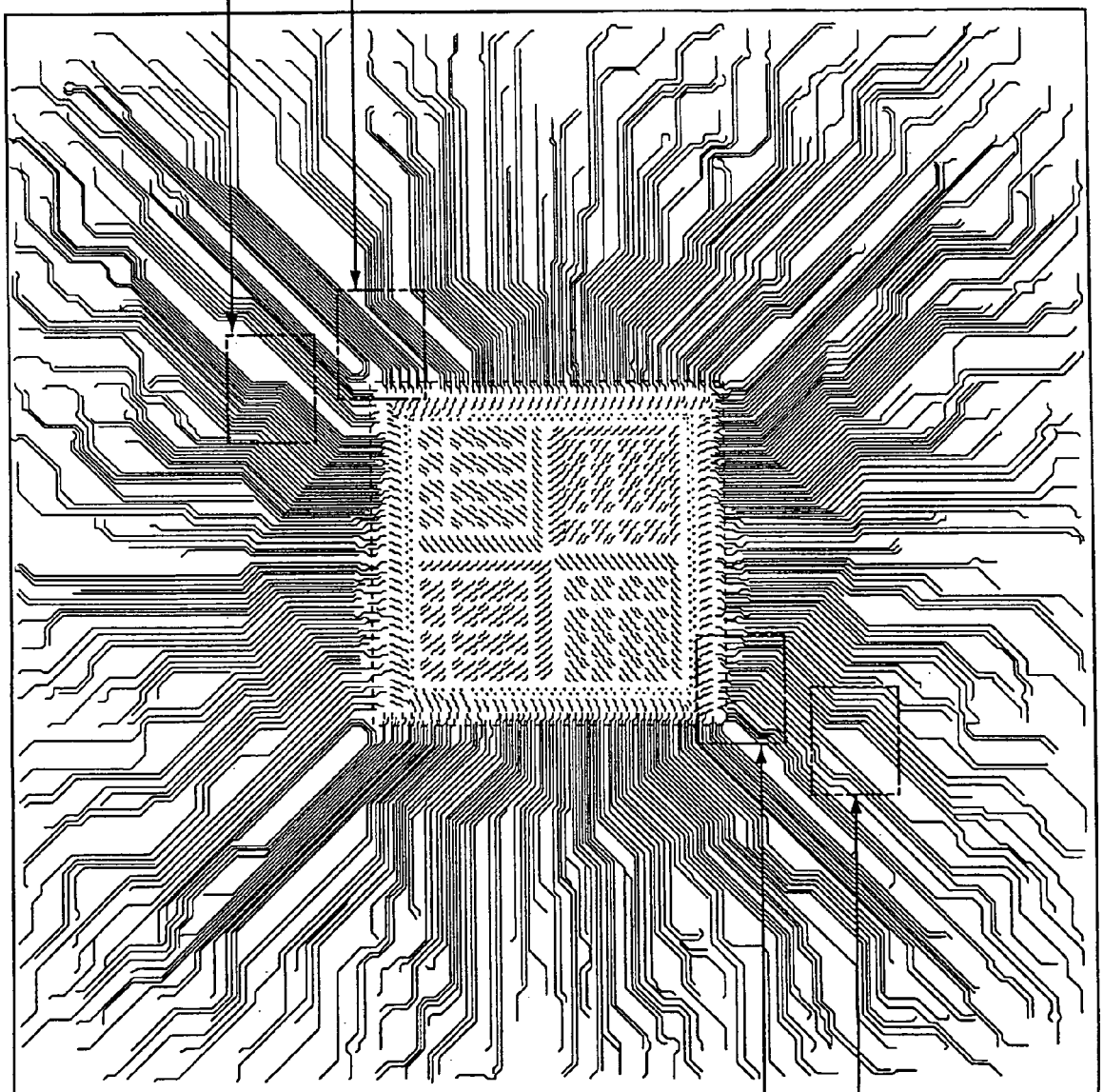
FIG. 3 shows the signal paths as determined in accordance with the method of an embodiment of the present invention.

FIG. 3 shows as a solution of an embodiment of the present invention, the custom routing provided in the ASIC package to provide impedance and cross-talk control. A further feature is to have the signals loop through the package so that it enters, brings the signal to the 1/0 structure of the die and continues on back out of the package toward the terminator mounted on the surface of the PWB. This allows for compensation on both sides of the load. FIG. 3 shows the custom traces required to achieve the nominal Rambus impedance. The wide traces are the Rambus RSL lines and the narrow traces are the "regular" minimum width (35 micron) traces which were used for crosstalk control as well as impedance control. FIGS. 4–7 show close-up or more precise views of the dimensions of these signal line traces.

At the top of the loop, where the flip chip C4 connections are made, there is a parasitic capacitance caused by the ESD diodes as well as I/0 transistor structures. With the given impedance levels of the bus, embodiments of the present invention are able to generate a correction impedance that could cancel out up to 2.5 pf of capacitance. For example, the connections were reduced in width to the 35 micron (minimum) for a length of 3.2 mm to cancel out the 1.8 pf of parasitic capacitance on-chip.

Figure 4:
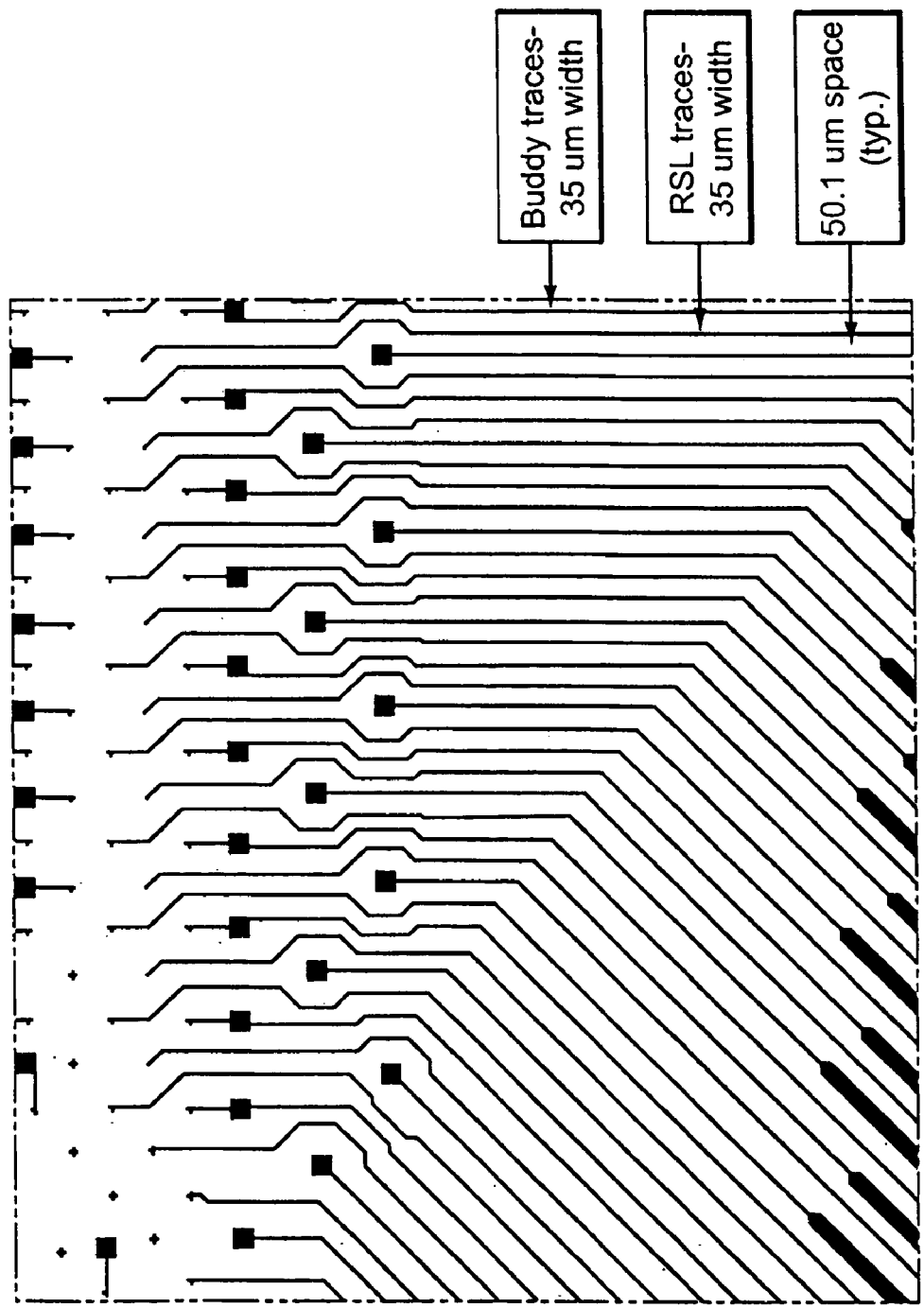
FIG. 4 shows a detailed view of the signal paths as determined in accordance with the method of the embodiment of the present invention.

FIG. 4 shows an example of a close up view of the bus signal paths in FIG. 3. It can be seen in this example that both the RSL traces and "buddy traces" are 35 um in width. The buddy traces act as electrical shields to intercept any crosstalk between adjacent paths. Any stray signals that enter the buddy traces will therefore be sent to ground and not cause distortion. This greatly enhances the integrity of the signals along the bus lines.

Figure 5:
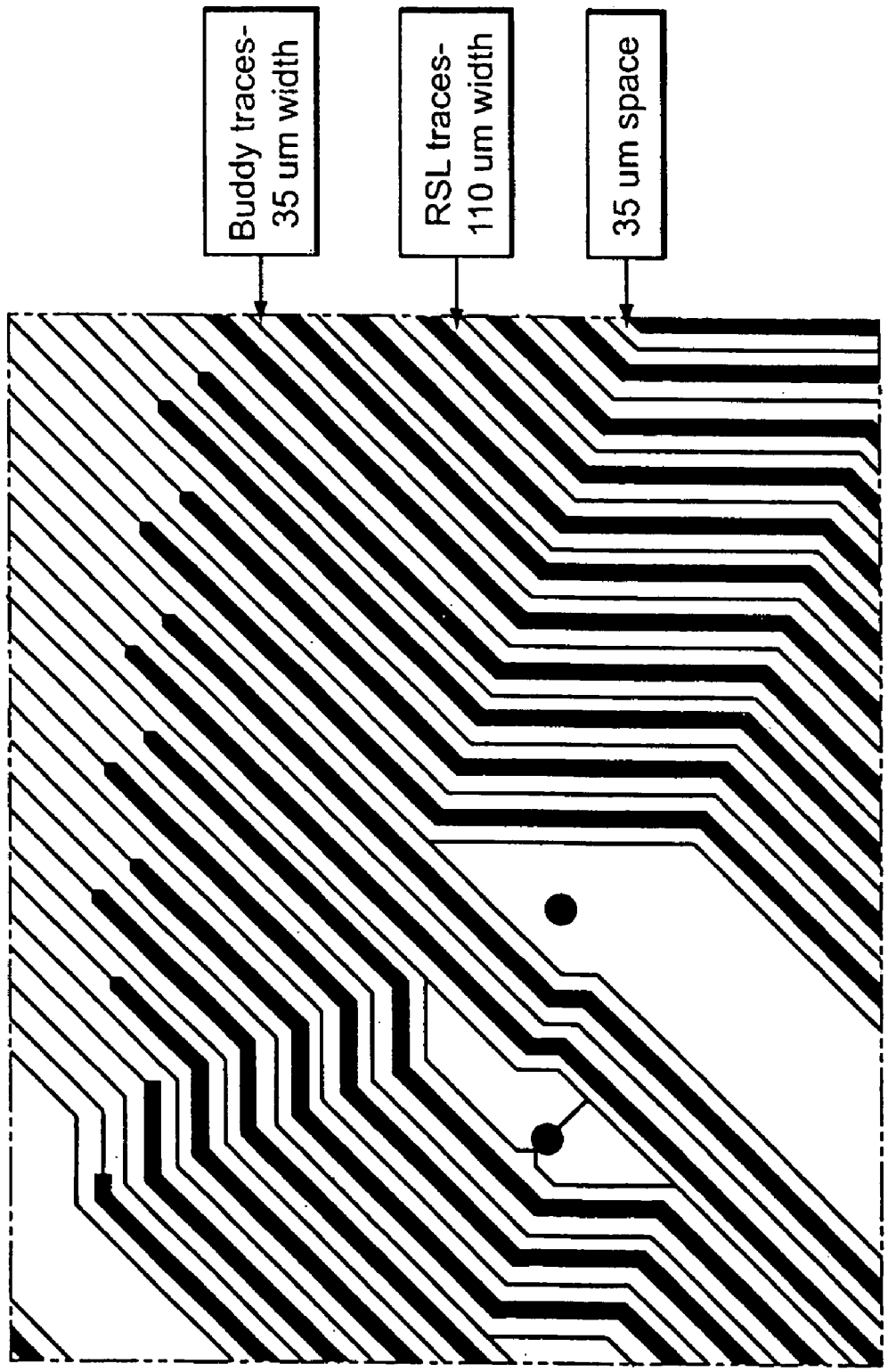
FIG. 5 shows another detailed view of the signal paths as determined in accordance with the method of the embodiment of the present invention.

FIG. 5 also shows a close up view of some signal paths. In this figure, it can be seen that the RSL traces are 110 um and the buddy traces are 35 um. This embodiment also shows that the spacing between the buddy traces and the RSL lines to be 35 um. It is also shown that the RSL lines change their width from 110 um to 35 um. It is this changing of signal path widths that is in accordance with embodiments of the present invention. As also seen in FIG. 4, for a length of 3.2 mm, the signal path just before entering the chip is reduced in width to 35 um.

Figure 6:
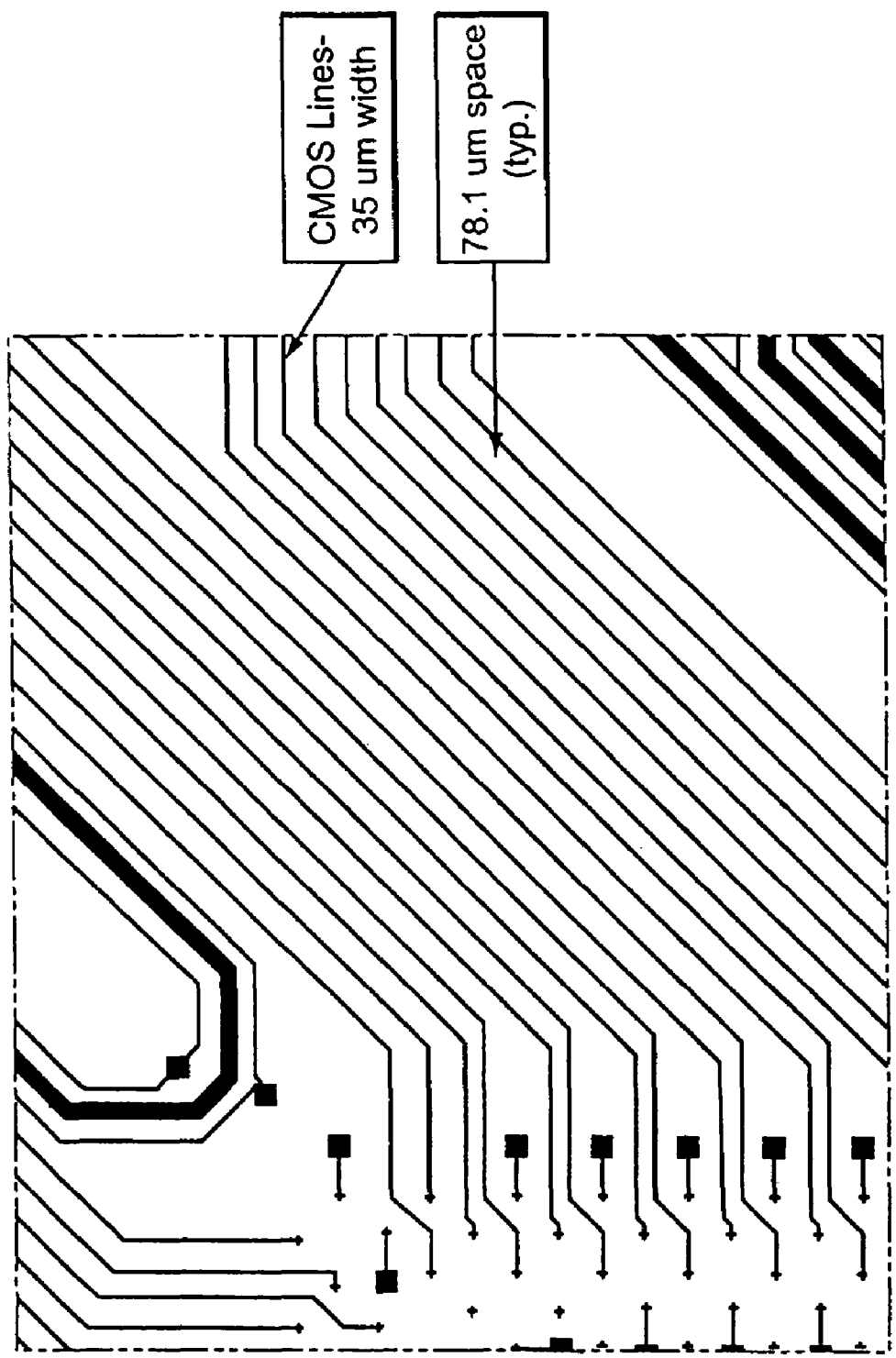
FIG. 6 shows another detailed view of the signal paths as determined in accordance with the method of the embodiment of the present invention.

FIG. 6 shows signal path CMOS lines that are 35 um in width with a spacing of 78.1 um between CMOS lines.

Figure 7:
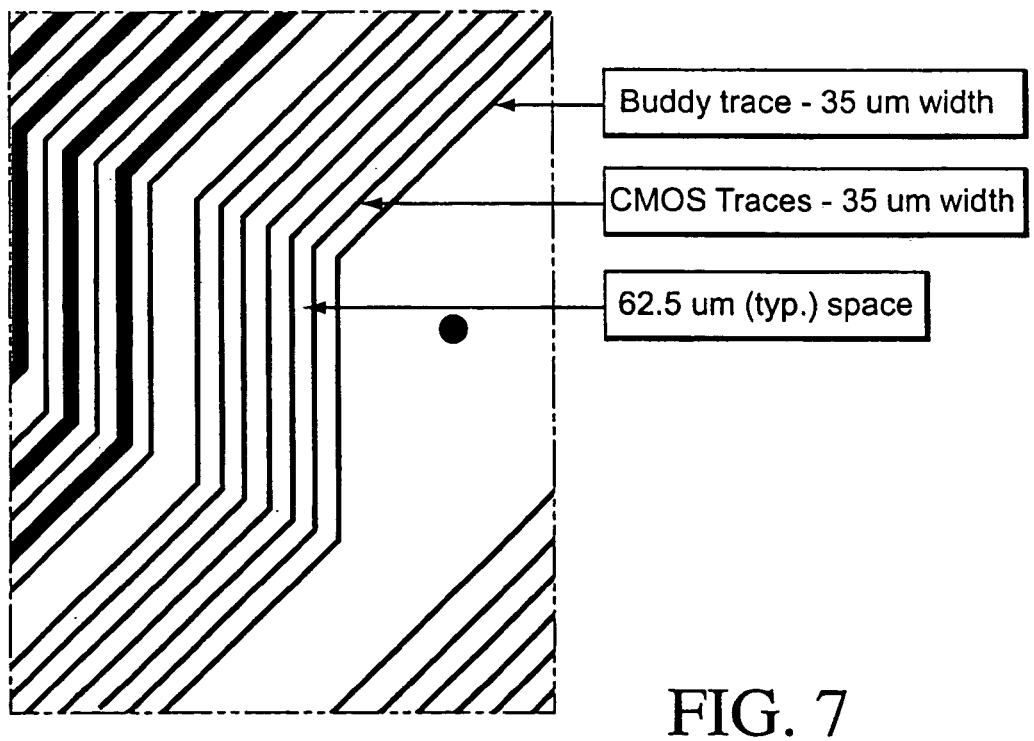
FIG. 7 shows another detailed view of the signal paths as determined in accordance with the method of the embodiment of the present invention.

FIG. 7 shows other CMOS signal paths that have adjacent buddy traces. In this area of the bus, the CMOS lines are 35 um in width with the buddy traces also being 35 um in width. The spacing is shown at 62.5 um in this embodiment.

It is noted that all prior art methods of bus connections do not approach the methods taught by embodiments of the present invention. It is common knowledge that problems with high speed busses existed, however no exact means to compensate for this has been determined until the teachings herein.

Finally, although the present invention has been described in accordance with the shown embodiments, variations to the embodiments would be apparent to those skilled in the art and those variations would be within the scope and spirit of the present invention. Accordingly, it is intended that the specification and embodiments shown be considered as exemplary only, with a true scope of the invention being indicated by the claims that follow and equivalents.

What is claimed is:

1. A signal transmission line, comprising:
   a parasitic element;
   a portion of the signal path before the parasitic element and a portion of the signal path after the parasitic element each portion having a length and a width adjusted so as to cancel unwanted electrical characteristics of the signal transmission line; and
   buddy traces located adjacent to the signal path in order to reduce electrical crosstalk.

2. The signal transmission line as recited in claim 1, wherein adjustment of the length and width of the signal path modified the reactance of the signal transmission line.

3. The signal transmission line as recited in claim 1, wherein the transmission line is disposed on a printed wiring board and connected to an integrated circuit mounted on the printed wiring board.

4. The signal transmission line as recited in claim 1, wherein length and width of the adjusted signal paths is identical before and after the portion of that signal path at which the parasitic element is present.

5. A signal transmission line, comprising:
   a parasitic element having an intrinsic capacitance located at a discontinuity portion of a signal transmission line which has an impedance; and
   a correction impedance having an associated delay that, based at least in part on the intrinsic capacitance and the correction impedance, is operative to increase the signal transmission line impedance, wherein the correction impedance is added to the signal transmission line so that one half of the calculated delay is added before and the other half of the calculated delay is added after the portion of the signal transmission line at which the parasitic element exists.

6. The signal transmission line as recited in claim 5, wherein the transmission line is disposed on a printed wiring board and connected to an integrated circuit mounted on the printed wiring board.

7. The signal transmission line as recited in claim 5, wherein the correction impedance is added by a change in the width of the signal transmission line.

8. The signal transmission line as recited in claim 7, wherein the transmission line is disposed on a printed wiring board and connected to an integrated circuit mounted on the printed wiring board.

9. The signal transmission line as recited in claim 5, wherein the correction impedance comprises an inductance that is placed before and after the parasitic element.

10. The signal transmission line as recited in claim 9, wherein the inductance is added by a change in the width of the signal transmission line.

11. The signal transmission line as recited in claim 10, wherein the transmission line is disposed on a printed wiring board and connected to an integrated circuit mounted on the printed wiring board.

12. A signal transmission line, comprising:
a parasitic element having an intrinsic inductance located at a discontinuity portion of a signal transmission line which has an impedance; and
a correction impedance having an associated delay that, based at least in part on the intrinsic inductance and the correction impedance, is operative to decrease the signal transmission line impedance, wherein the correction impedance is added to the signal transmission line so that one half of the calculated delay is added before and the other half of the calculated delay is added after the portion of the signal transmission line at which the parasitic element exists.

13. The signal transmission line as recited in claim 12, wherein the transmission line is disposed on a printed wiring board and connected to an integrated circuit mounted on the printed wiring board.

14. A signal transmission line, comprising:
a parasitic element, be it a capacitive or an inductive parasitic element, that exists at a portion of the signal transmission line which has an impedance; and
a correction transmission line having a delay associated with a correction impedance of the correction transmission line that, based at least in part on the parasitic element value and the correction impedance of the correction transmission line, is operative to increase the signal transmission line impedance if the parasitic element is capacitive and to decrease the signal transmission line impedance if the parasitic element is inductive, wherein the correction transmission line is divided into two halves, wherein the two halves of the correction transmission line are added to the portion of the signal transmission line at which the parasitic element exists, and wherein one half is added before and the other half is added after the parasitic element.

15. The signal transmission line as recited in claim 14, wherein the transmission line is disposed on a printed wiring board and connected to an integrated circuit mounted on the printed wiring board.

16. A signal transmission line, comprising:
a parasitic element having a value, be it a capacitive or an inductive parasitic element, that exists at a portion of the signal transmission line which has an impedance; and
a correction transmission line having a delay associated with a correction impedance of the correction transmission line that, based at least in part on the parasitic element value and the correction impedance of the correction transmission line, is operative to increase the signal transmission line impedance if the parasitic element is capacitive and to decrease the signal transmission line impedance if the parasitic element is inductive, wherein the correction transmission line is placed at the portion of the signal transmission line at which the parasitic element exists, wherein the correction transmission line is divided equally and wherein the half-parts of the correction transmission line are added one before and one after the parasitic element.

17. The signal transmission line as recited in claim 16, wherein the transmission line is disposed on a printed wiring board and connected to an integrated circuit mounted on the printed wiring board.

18. The signal transmission line as recited in claim 16, wherein the correction transmission line counteracts the effects of the parasitic element.

19. The signal transmission line as recited in claim 16, wherein the correction transmission line results in the impedance of the correction transmission line matching the impedance of the signal transmission line.

20. The signal transmission line as recited in claim 16, wherein the parasitic element includes a via.

21. The signal transmission line as recited in claim 20, wherein the transmission line is disposed on a printed wiring board and connected to an integrated circuit mounted on the printed wiring board.

* * * * *